United States Patent
Ikezawa

(10) Patent No.: US 9,030,811 B2
(45) Date of Patent: May 12, 2015

(54) ELECTRONIC DEVICE CHASSIS AND ELECTRONIC DEVICE

(71) Applicant: TDK Corporation, Tokyo (JP)

(72) Inventor: Akira Ikezawa, Tokyo (JP)

(73) Assignee: TDK Corporation, Tokyo (JP)

( * ) Notice: Subject to any disclaimer, the term of this patent is extended or adjusted under 35 U.S.C. 154(b) by 239 days.

(21) Appl. No.: 13/680,145

(22) Filed: Nov. 19, 2012

(65) Prior Publication Data

US 2013/0176664 A1   Jul. 11, 2013

(30) Foreign Application Priority Data

Jan. 6, 2012   (JP) .................................. 2012-000923

(51) Int. Cl.
| | |
|---|---|
| *H05K 5/00* | (2006.01) |
| *H05K 7/00* | (2006.01) |
| *A47G 1/10* | (2006.01) |
| *H05K 5/02* | (2006.01) |

(52) U.S. Cl.
CPC ............ *H05K 5/0239* (2013.01); *H05K 5/0052* (2013.01)

(58) Field of Classification Search
USPC ............... 361/679.01–679.09, 679.1–679.19, 361/679.21–679.29, 679.31–679.45, 361/679.55–679.6, 724–747; 248/679.01–679.09, 679.1–679.19, 248/679.21–679.29, 679.31–679.45, 248/679.55–679.6, 724–747; 292/1–62, 292/113, 169.11–169.23, 341.11–341.19

See application file for complete search history.

(56) References Cited

U.S. PATENT DOCUMENTS

| | | | |
|---|---|---|---|
| 6,268,882 B1 * | 7/2001 | Elberbaum ................... 348/151 |
| 6,552,870 B2 * | 4/2003 | Komatsu et al. ........... 360/99.23 |
| 2012/0044657 A1 * | 2/2012 | Lostoski et al. .............. 361/752 |

FOREIGN PATENT DOCUMENTS

JP    A-2007-216836    8/2007

* cited by examiner

*Primary Examiner* — Jerry Wu
(74) *Attorney, Agent, or Firm* — Posz Law Group, PLC

(57) ABSTRACT

An electronic device chassis includes a base plate for disposing an electronic device circuit thereon, and a cover for the electronic device circuit housing. The base plate includes a bottom portion and a wall portion. The wall portion includes a screw fastening portion including a contact surface that contacts the cover. The cover includes a screw hole for attaching the base plate. The contact surface of the screw fastening portion is higher than an upper surface other than the contact surface of the wall portion. The upper surface portion covers the side of the housing space facing the base plate. The external side surface cover is provided at a peripheral edge of the upper surface cover portion, and extends toward the base plate so as to be longer than a difference between the contact surface of the screw fastening portion and the upper surface of the wall portion.

8 Claims, 4 Drawing Sheets

ELECTRONIC DEVICE CHASSIS AND ELECTRONIC DEVICE

CROSS-REFERENCE TO PRIOR APPLICATION

This application relates to and claims the benefit of priority from Japanese Patent Application number 2012-000923, filed on Jan. 6, 2012 the entire disclosure of which is incorporated herein by reference.

BACKGROUND

The present invention relates to an electronic device chassis for housing an electronic device circuit, and an electronic device.

Conventionally, in hybrid vehicles, electric vehicles and the like, electronic devices such as, for example, DC-DC converter units are used. In such electronic devices, in order to protect a circuit of the electronic device (electronic device circuit) from dew condensation, dirt, dust and the like, the electronic device circuit is housed in a chassis.

As techniques for a chassis for housing an electronic device circuit, for example, an in-vehicle electronic device circuit module in which a chassis is divided into a first body and a second body, a substrate is held by a support portion of the second body, and a protection defining wall is in close pressure contact with the substrate is known (see, for example, Japanese Patent Laid-Open No. 2007-216836).

SUMMARY

Such a chassis for housing an electronic device circuit includes a base plate for mounting an electronic device circuit thereon and a sheet-metal cover. In this configuration, an entire upper surface of a wall of the base plate that surrounds the electronic device circuit is subjected to machine processing for flatness enhancement to properly bring the upper surface of the wall of the base plate and the sheet-metal cover into close contact with each other, whereby dust and water resistance can be expected to be maintained.

However, with this configuration, for example, when the entire upper surface of the wall of the base plate that surrounds the electronic device circuit is subjected to machine processing, the area subjected to machine processing is large and a large number of man-hours are required for the base plate processing, causing the problem of a high processing cost for the base plate.

An object of the present invention is to manufacture an electronic device chassis easily at a reduced processing cost.

An electronic device chassis according to a first aspect of the present invention includes a base plate for disposing an electronic device circuit thereon, and a cover for covering a housing space for the electronic device circuit. The base plate includes a bottom portion for disposing the electronic device circuit thereon, and a wall portion erected relative to the bottom portion and defining a periphery of the housing space for housing the electronic device circuit.

The wall portion includes a screw fastening portion including a contact surface in contact with the cover.

A screw hole for fixing the cover to the base plate is formed to the screw fastening portion. The screw fastening portion, for example, is provided each of four corners of the wall portion. The contact surface of the screw fastening portion is located at a position higher than an upper surface of the wall portion other than the contact surface. The contact surface of the screw fastening portion is, for example, horizontal, and the upper surface of the wall portion has a height such that the upper surface is not contact with the cover (that is, a height that provides a space between the upper surface and the cover) when the cover is in contact with the contact surface of the screw fastening portion.

The cover includes an upper surface cover portion and an external side surface cover portion. The upper surface cover portion is a cover portion for covering a side of the housing space, the side facing the base plate. The external side surface cover portion is provided at a peripheral edge of the upper surface cover portion, and extends toward the base plate so as to be longer than a difference between the contact surface of the screw fastening portion and the upper surface of the wall portion.

As a second aspect, in the electronic device chassis according to the first aspect, the external side surface cover portion can be formed by bending a member of the cover toward the base plate.

As a third aspect, in the electronic device chassis according to the second aspect, the member of the cover can include a notch at each of four corners thereof.

As a fourth aspect, in the electronic device chassis according to any of the first through third aspects, the screw hole can be provided offset from a center of the contact surface of the screw fastening portion to the electronic device circuit side.

As a fifth aspect, in the electronic device chassis according to any of the first through fourth aspects, a substrate that is long in a longitudinal direction of the housing space may be disposed on a first surface side of the wall portion surrounding the housing space, and the wall portion can further include one or more screw fastening portions each at a position closer to a second surface facing the first surface than to the first surface.

An electronic device according to a six aspect of the present invention includes an electronic device chassis according to any of the first through fifth aspects, and an electronic device circuit disposed in the electronic device chassis.

DETAILED DESCRIPTION OF THE EMBODIMENT

An embodiment of the present invention will be described with reference to the drawings. The below-described embodiment is not intended to limit the invention according to the claims, and not all the components and combinations thereof described in the embodiment are essential for a solution provided by the invention.

Hereinafter, a DC-DC converter unit 10 to which an electronic device according to an embodiment of the present invention has been applied will be described.

Figure 1:
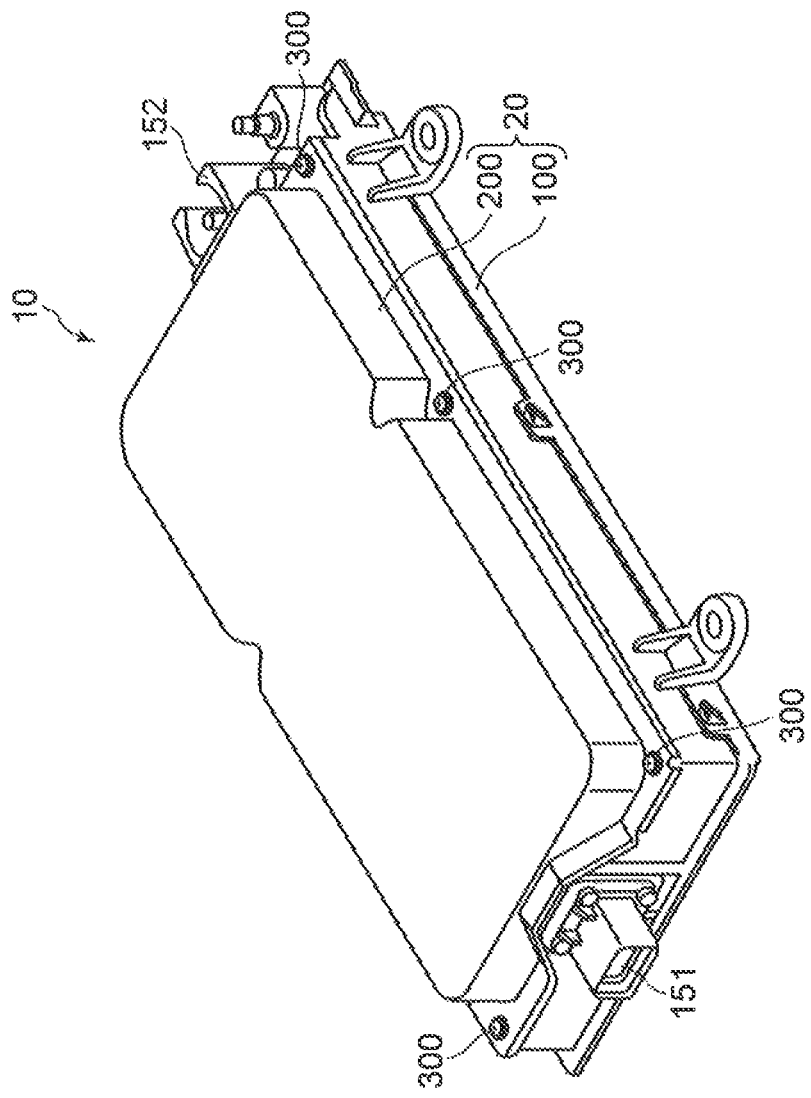
FIG. 1 is a perspective diagram illustrating a configuration of a DC-DC converter unit according to an embodiment of the present invention.

FIG. 1 is a perspective diagram illustrating a configuration of a DC-DC converter unit according to an embodiment of the present invention.

A DC-DC converter unit 10 is, for example, mounted in a hybrid vehicle or an electric vehicle, and coverts a high direct current voltage supplied from a high-voltage battery that stores a voltage of around 100 to 500 V to a low direct current voltage and supplies the low direct current voltage to a low-voltage battery that stores a voltage of around 12 to 16 V.

The DC-DC converter unit 10 includes a chassis 20 configured by combining a base plate 100 and a cover 200. The base plate 100 and the cover 200 are combined and fixed to each other via fixing members such as screws 300. An electronic device circuit 150 (see FIG. 2) is housed inside the chassis 20. An input terminal 151 of the electronic device circuit 150 is provided so as to project outward from a first surface of the chassis 20 (for example, one of side surfaces in a longitudinal direction of the chassis 20), and an output terminal 152 is provided so as to project outward from a second surface of the chassis 20 (for example, the other side surface in the longitudinal direction of the chassis 20).

Figure 2:
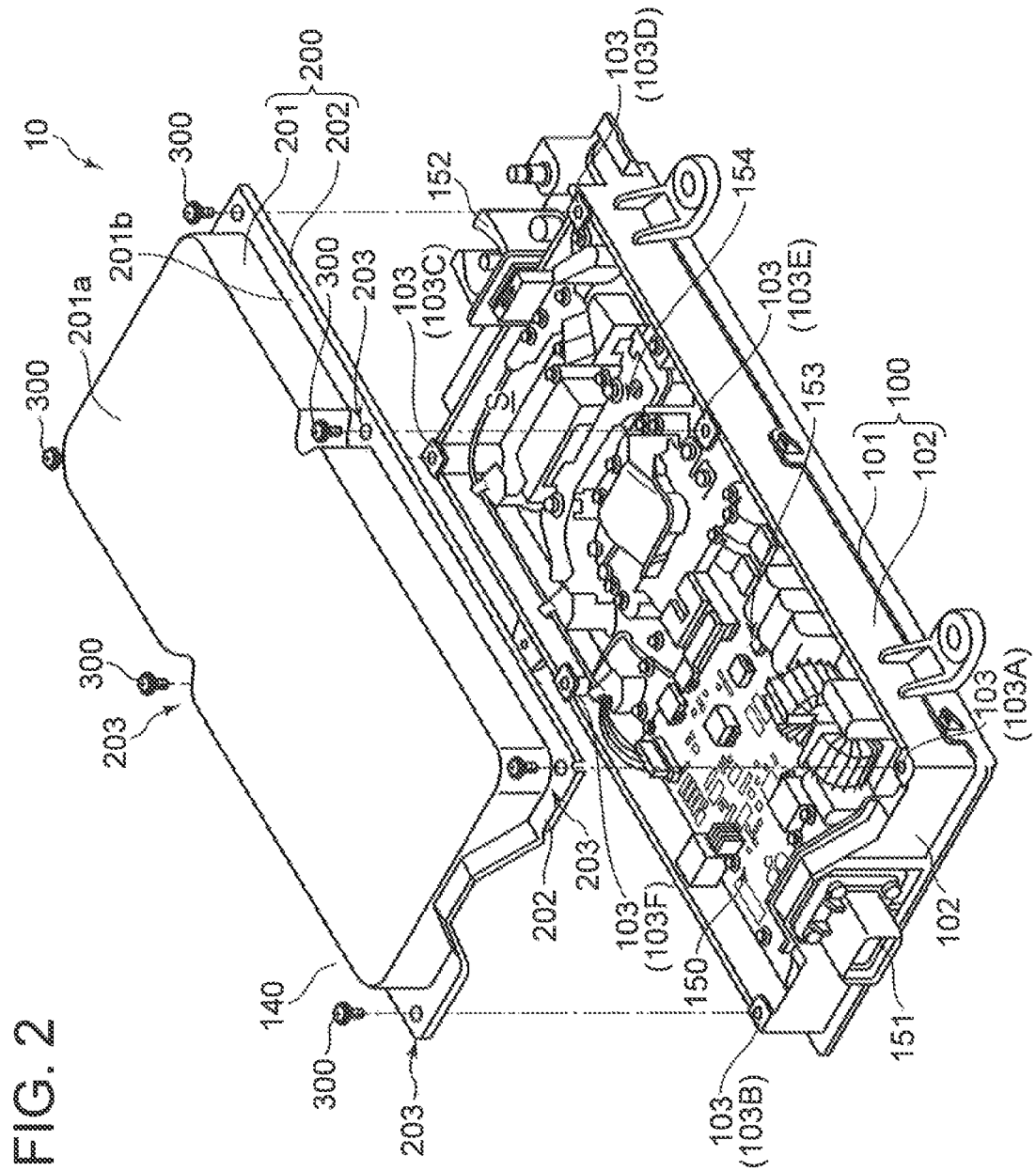
FIG. 2 is an exploded perspective view of the DC-DC converter unit according to the embodiment of the present invention.

FIG. 2 is an exploded perspective view of the DC-DC converter unit according to the embodiment of the present invention.

The base plate 100 is formed of, for example, a metal such as aluminum and so forth, and includes a bottom portion 101 for attaching the electronic device circuit 150 thereto, and a wall portion 102 that is erected at a peripheral edge portion of the bottom portion 101 and defines side surfaces of a housing space S for housing the electronic device circuit 150. The bottom portion 101 has a substantially rectangular shape, and therefore, the wall portion 102 has a shape of a substantially rectangular frame as viewed from the upper side (here, "upper" refers to a direction from which the electronic device circuit 150 is attached to the base plate 100), that is, in a planar view. The bottom portion 101 and the wall portion 102 form a substantially cuboidal housing space S with an upper side opened in which the electronic device circuit 150 is housed.

The wall portion 102 includes a screw fastening portion 103 (103A through 103D) to which a screw 300 for fixing the cover 200 is fastened, at each of four corners thereof. Also, the wall portion 102 includes two screw fastening portions 103 (103E and 103F) at positions closer to the output side (output terminal 152) relative to a center in the longitudinal direction of the wall portion 102.

The electronic device circuit 150 includes an input smoothing portion, a control portion, a switching portion, a transformer, a rectifier portion and an output smoothing portion. In the present embodiment, in an input-side region 153 on the input side (input terminal 151 side) relative to the two screw fastening portions 103E and 103F, the input smoothing portion, the control portion and the switching portion are provided, and in an output-side region 154 on the output side relative to the two screw fastening portions 103E and 103F, the transformer, the rectifier portion and the output smoothing portion are provided. In the present embodiment, a substrate of the control portion in the electronic device circuit 150 has a relatively large size (specifically, the substrate is longer than a half of a length in the longitudinal direction of the chassis 20), and thus, the two screw fastening portions 103E and 103F are disposed at positions closer to the output side relative to the center of the wall portion 102 in the longitudinal direction of the chassis 20. As described above, the screw fastening portions 103 are disposed closer to the output side, enabling a decrease in amount of deformation caused by, e.g., an impact of the part of the output side of the cover 200 and so forth, for example, enabling proper prevention of damage of a magnetic core of the transformer provided in the output-side region 154, which is relatively vulnerable to an impact (for example, more vulnerable to an impact than the input-side region 153).

The cover 200 includes an upper surface cover portion 201 for covering an upper portion of the electronic device circuit 150, and an external side surface cover portion 202 for covering an upper end part of an external side surface of the wall portion 102 of the base plate 100. The upper surface cover portion 201 includes an upper center portion 201a for covering the housing space S, and an upper peripheral edge portion 201b including a flat surface corresponding to an upper surface of the wall portion 102 of the base plate 100. In order to prevent the cover 200 from being brought into contact with, the electronic device circuit 150 when the cover 200 is brought into contact with upper surfaces (contact surfaces) of the screw fastening portions 103, the upper surface cover portion 201 has a height from the upper peripheral edge portion 201b. The upper surface cover portion 201 includes a cover fixing portion 203 at each of parts facing the respective screw fastening portions 103 of the wall portion 102 of the base plate 100.

Figure 3:
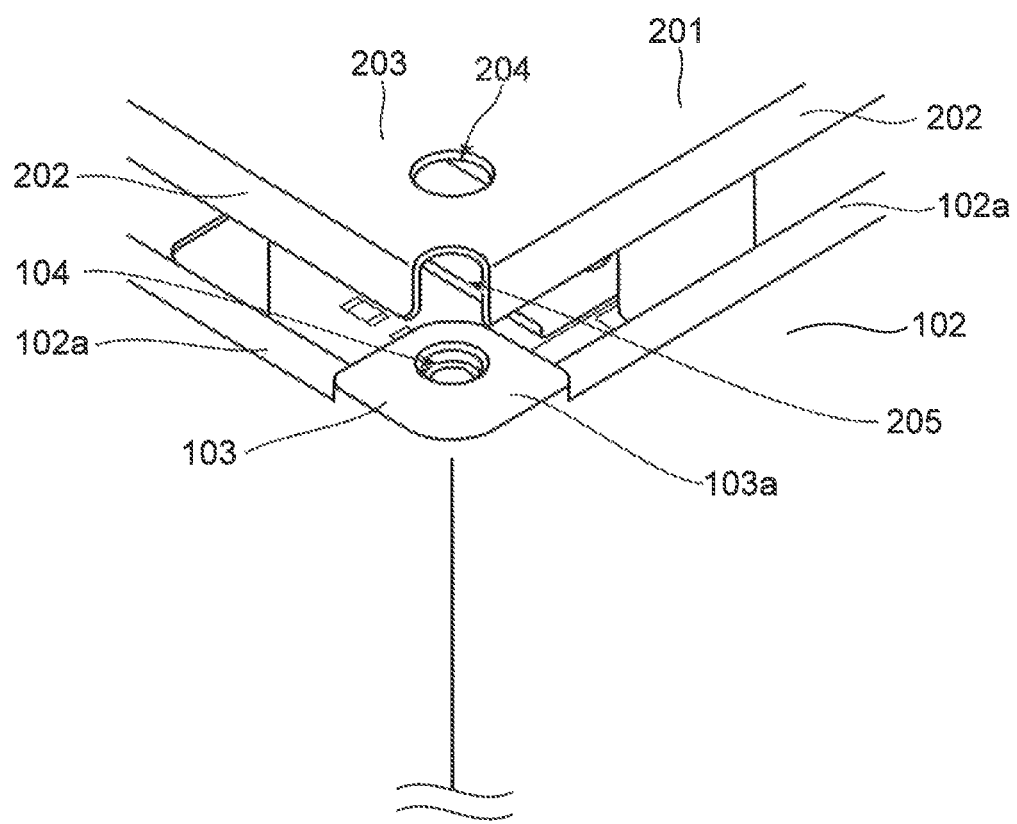
FIG. 3 is an enlarged view of an area including a screw fastening portion 103A, which is illustrated in FIG. 2.

FIG. 3 is an enlarged view of an area including the screw fastening portion 103A, which is illustrated in FIG. 2. Although the below description will be provided mainly in terms of a part including the screw fastening portion 103A, the description is not limited to the part including the screw fastening portion 103A and the same applies to the other screw fastening portions. Also, in the present embodiment, a part in the vicinity of the input terminal 151 of the wall portion 102 has a shape corresponding to the input terminal 151, and thus, here, the description will be provided with exception of such part.

An upper surface 103a of the screw fastening portion 103A is a flat surface, and a screw hole 104 for inserting a screw 300 for fixing the cover 200 is provided.

The upper surface 103a of the screw fastening portion 103A is located at a position higher than an upper surface 102a of the wall portion 102 (for example, at a position higher than the upper surface 102a by around 1 mm). In other words, at the upper surface 102a of the wall portion 102, the screw fastening portion 103A is higher than the upper surface 102a of the wall portion 102. An upper surface 103a of the screw fastening portion 103A is substantially horizontal, and the upper surface 102a of the wall portion 102 has a height such that the upper surface 102a is not in contact with the cover 200 (that is, a height, that provides a space between the upper surface 102a and the cover 200) when the cover 200 is in contact with the upper surface 103a of the screw fastening portion 103A.

In the present embodiment, the flatness of the upper surface 103a of the screw fastening portion 103A of the wall portion 102 is enhanced by machine processing, while the upper surface 102a of the other part (peripheral part) is not subjected to machine processing for flatness enhancement. Thus, the processing cost for machine processing of the base plate 100 can be reduced.

A back surface of the cover fixing portion 203, which is to be in contact with the upper surface 103a of the screw fastening portion 103A is a flat surface. At the cover fixing portion 203, an opening 204 for inserting a shaft of a screw 300 therethrough is formed. Also, at a corner part of the cover fixing portion 203, a notch 205 is formed.

At a peripheral edge of the cover 200, the external side surface cover portion 202 extending downward is formed. A length of the downward extension of the external side surface cover portion 202 is, for example, around 5 mm. Upon the cover 200 being put on the base plate 100, the back surface of the cover fixing portion 203 and the upper surface 103a of the screw fastening portion 103A are brought into contact with each other, whereby an edge of the external side surface cover portion 202 is located at a position lower than the upper surface 102a of the wall portion 102. The external side surface cover portion 202 may be in contact with the external side surface of the wall portion 102. Since the upper surface 103a of the screw fastening portion 103A is located at a position higher than the periphery thereof, a space is formed between a lower surface of the upper surface cover portion 201 and the upper surface 102a of the wall portion 102. However, the length of the downward extension of the external side surface cover portion 202 is sufficiently long compared to a difference in height between the upper surface 103a of the screw fastening portion 103A and the upper surface 102a of the wall portion 102, enabling the space between the upper surface cover portion 201 and the upper surface 102a of the wall portion 102 to be completely covered by the external side surface cover portion 202.

Also, as a result of provision of the notch 205, there is a part of the external side surface of the wall portion 102 that is not covered by the external side surface cover portion 202; however, in a state in which the cover 200 is put on the base plate 100, the notch 205 is positioned at the external side surface of the wall portion 102, and the external side surface cover portion 202 is brought into contact with the external side surface of the wall portion 102, and furthermore, the notch 205, which has an arc shape and is provided on the upper surface cover portion 201 side, is positioned at the upper surface 103a of the screw fastening portion 103A, enabling prevention of generation of a gap that communicates with the inside of the housing space S. Also, in order to prevent the notch 205 and the opening 204 from being connected to each other as a result of the notch 205 and the opening 204 being provided too close to each other, disabling fixing between the screw 300 and the cover 200, the screw hole 104 is provided offset to the electronic device circuit 150 side relative to a center of the upper surface 103a of the screw fastening portion 103A. Consequently, a wide flat part on the wall portion 102 side of the upper surface 103a can be provided, enabling the arc-shaped notch 205 provided on the upper surface cover portion 201 side to be more reliably positioned on the upper surface 103a.

Figure 4:
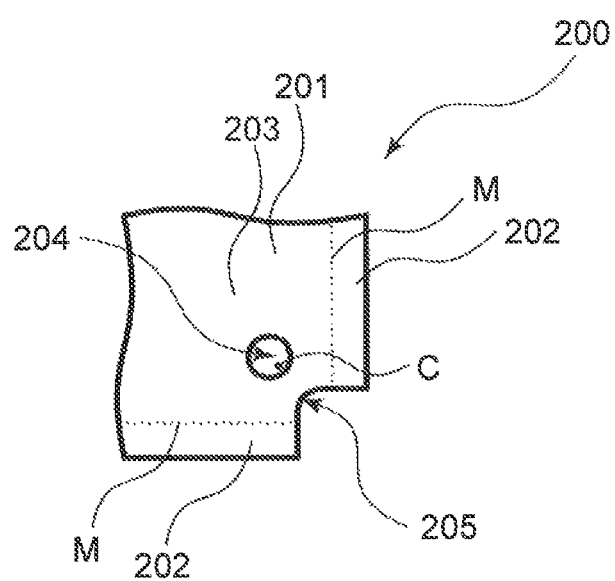
FIG. 4 is a diagram illustrating a configuration of a part of a cover and a method for manufacturing the cover, according to the embodiment of the present invention.

FIG. 4 is a diagram illustrating a part of a configuration of a cover and a method for manufacturing the cover, according to the embodiment of the present invention.

In the present embodiment, for example, a flat plate-like sheet metal is subjected to press working so as to have a shape of an upper surface cover portion 201, and subsequently, a peripheral edge part of the upper surface cover portion 201 is cut so as to have a shape of an external side surface cover portion 202 (including notches 205), an opening 204 is drilled at each of six positions, and then the external side surface cover portion 202 is bent, thereby manufacturing a cover 200. However, the method for manufacturing the cover 200 is not limited to the above example.

Before the processing for bending the external side surface cover portion 202 is performed, as illustrated in FIG. 4, a cover fixing portion 203 and the external side surface cover portion 202 are located, on a same plane, and from such state, the bending processing for making a mountain fold along lines M so that the external side surface cover portion 202 extends downward. In the present embodiment, the notches 205 are formed before the bending processing, and thus, even though the bending processing is performed, it is possible to properly prevent two external side surface cover portions 202 with a notch 205 therebetween from overlapping each other.

The cover 200 in the present embodiment can be manufactured by such an easy process as described above, enabling reduction in processing cost.

Although the present invention has been described based on the embodiment, the present invention is not limited to the above-described embodiment and is applicable to various other modes.

For example, although in the above embodiment, the screw fastening portions 103 are provided at six positions, the present invention is not limited to this example and a number of screw fastening portions 103 exceeding that number may be provided.

Furthermore, in the above embodiment, although the screw fastening portions 103E and 103F are disposed at positions closer to the output side, the present invention is not limited to this example, and for example, where components relatively vulnerable to an impact are provided on the input side, the screw fastening portions 103E and 103F may be disposed at positions closer to the input side.

Also, the electronic device circuit is not limited to a power supply circuit such as an in-vehicle DC-DC converter (for example, a switching power supply circuit), and may be another type of electronic device circuit.

What is claimed is:

1. An electronic device chassis comprising:
    a base plate; and
    a cover covering the base plate and together with the base plate forming a housing for housing an electronic device circuit,
    the base plate including
        a bottom portion for disposing the electronic device circuit thereon, and
        a wall portion extending in an upward direction from a periphery of the bottom portion and forming a side portion of the housing having a sufficient height for surrounding the electronic device circuit,
    the wall portion including:
        an upper surface having contact surfaces and non-contact surfaces, the contact surfaces contacting the cover, and the non-contact surfaces being spaced from the cover and not contacting the cover,
        one contact surface having a screw fastening portion including a screw hole receiving a screw for fixing the cover to the base plate,
        the contact surfaces and non-contact surfaces of the wall portion each having a height in the upward direction of the wall portion extending from the bottom portion of the base plate, and the height of the contact surfaces being greater than the height of the non-contact surfaces,
        differences in the heights between the contact surfaces and the non-contact surfaces providing a gap between the cover and non-contact surfaces of the upper surface of the wall portion as the screw and the screw hole of screw fastening portion fix the cover to the base plate; and
    the cover including:
        an upper portion facing and covering the base plate of the housing, and
        an external side extending in a downward direction from a peripheral edge of the upper portion and beyond the gap formed between the cover and non-contact surfaces of the upper surface of the wall portion, a downward length of the external side being greater than the differences in heights between the contact surfaces and the non-contact surfaces of the upper surface of the upper wall portion.

2. An electronic device chassis according to claim 1, wherein the external side of the cover is joined to the upper portion of the cover by a bent portion.

3. An electronic device chassis according to claim 2, wherein the cover includes a notch at each of four corners thereof.

4. An electronic device chassis according to claim 1, wherein the screw hole is offset from a center of the one contact surface toward a center of the housing.

5. An electronic device comprising an electronic device circuit housed in the electronic device chassis according to claim 1, wherein
- a substrate of the electronic circuit device is disposed within the housing with a longer dimension of the substrate extending in a longitudinal direction of the housing,
- one end of the substrate has an input terminal and another end of the substrate has an output terminal, and
- the wall portion of the housing includes at least one additional screw fastening portion arranged at a position closer to the output terminal than to the input terminal.

6. An electronic device comprising:
- an electronic device chassis; and
- an electronic device circuit disposed in the electronic device chassis;
- the electronic device chassis comprising:
- a base plate; and
- a cover covering the base plate and together with the base plate forming a housing for housing the electronic device circuit, the base plate including
  - a bottom portion for disposing the electronic device circuit thereon, and
  - a wall portion extending in an upward direction from a periphery of the bottom portion and forming a side portion of the housing having a sufficient height for surrounding the electronic device circuit,
- the wall portion including:
  - an upper surface having contact surfaces and non-contact surfaces, the contact surfaces contacting the cover, and the non-contact surfaces being spaced from the cover and not contacting the cover,
  - one contact surface having a screw fastening portion including a screw hole receiving a screw for fixing the cover to the base plate,
  - the contact surfaces and non-contact surfaces of the wall portion each having a height in the upward direction of the wall portion extending from the bottom portion of the base plate, and the height of the contact surfaces being greater than the height of the non-contact surfaces,
  - differences in the heights between the contact surfaces and the non-contact surfaces providing a gap between the cover and non-contact surfaces of the upper surface of the wall portion as the screw and the screw hole of screw fastening portion fix the cover to the base plate; and
- the cover including:
  - an upper portion facing and covering the base plate of the housing space, and
  - an external side extending in a downward direction from a peripheral edge of the upper portion and beyond the gap formed between the cover and non-contact surfaces of the upper surface of the wall portion, a downward length of the external side being greater than the differences in heights between the contact surfaces and the non-contact surfaces of the upper surface of the upper wall portion.

7. An electronic device chassis according to claim. 1, further comprising:
- two of the contact surfaces having a screw fastening portion, and
- the gap between the cover and non-contact surfaces of the upper surface of the wall portion extending between the two contact surfaces having a screw fastening portion.

8. An electronic device chassis according to claim 1, further comprising:
- the gap between the cover and non-contact surfaces of the upper surface of the wall portion is about 1 mm, and
- the external side of the cover extends in the downward direction about 5 mm.

* * * * *